United States Patent
Moriya

(10) Patent No.: US 8,456,334 B2
(45) Date of Patent: Jun. 4, 2013

(54) VARIABLE-LENGTH CODE DECODING APPARATUS, DECODING SYSTEM, AND VARIABLE-LENGTH CODE DECODING METHOD

(75) Inventor: Akira Moriya, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 13/330,297

(22) Filed: Dec. 19, 2011

(65) Prior Publication Data

US 2013/0002458 A1    Jan. 3, 2013

(30) Foreign Application Priority Data

Jun. 30, 2011    (JP) .................................. 2011-146343

(51) Int. Cl.
*H03M 7/40*    (2006.01)
(52) U.S. Cl.
USPC ................................ 341/67; 341/65; 382/246
(58) Field of Classification Search
USPC ....................................... 341/65, 67; 382/246
See application file for complete search history.

(56) References Cited

U.S. PATENT DOCUMENTS

| | | | | |
|---|---|---|---|---|
| 5,617,089 A | * | 4/1997 | Kinouchi et al. ............... | 341/65 |
| 5,841,380 A | | 11/1998 | Sita et al. | |
| 5,949,356 A | * | 9/1999 | Kim et al. ....................... | 341/67 |
| 6,069,575 A | * | 5/2000 | Kinouchi et al. ............... | 341/67 |
| 6,954,555 B2 | * | 10/2005 | Shimada ....................... | 382/246 |

FOREIGN PATENT DOCUMENTS

| | | |
|---|---|---|
| JP | 2004-056417 | 2/2004 |
| JP | 2004-228898 | 8/2004 |
| JP | 2006-042336 | 2/2006 |
| JP | 2007-158698 | 6/2007 |

OTHER PUBLICATIONS

Background Art Information in 1 page, Feb. 2011.

* cited by examiner

*Primary Examiner* — Khai M Nguyen
(74) *Attorney, Agent, or Firm* — Knobbe Martens Olson & Bear LLP

(57) ABSTRACT

A variable-length code decoding apparatus has a first table storing part capable of converting the variable-length codes into first decoded data comprising successive zeros, a second table storing part capable of converting a variable-length code and for which corresponding decoded data comprises no zeros, a third table storing part capable of converting a variable-length code comprising a code length of N and for which corresponding decoded data comprises no zeros or capable of converting a combination of the variable-length codes, a bit shifting part configured to shift the input bitstream by a specific number of bits, a fourth table storing part capable of converting a variable-length code at a header of the bit-shifted input bitstream into fourth decoded data, a combining part configured to combine the second or the third decoded data and the fourth decoded data.

20 Claims, 4 Drawing Sheets

| VARIABLE-LENGTH CODE | LAST | RUN | LEVEL | DECODED DATA |
|---|---|---|---|---|
| (10s) | 0 | 0 | 1 | 1 |
| (1111s) | 0 | 0 | 3 | 3 |
| (010101s) | 0 | 0 | 6 | 6 |
| (0010111s) | 0 | 0 | 9 | 9 |
| (000111111s) | 0 | 0 | 10 | 10 |
| (000100100s) | 0 | 0 | 13 | 13 |
| (0000100001s) | 0 | 0 | 14 | 14 |
| (0000100000s) | 0 | 0 | 17 | 17 |
| (00000000111s) | 0 | 0 | 18 | 18 |
| (00000000110s) | 0 | 0 | 21 | 21 |
| (00000100000s) | 0 | 0 | 22 | 22 |
| (110s) | 0 | 0 | 23 | 23 |
| (0111s) | 1 | 0 | 1 | 1 |
| (001100s) | 1 | 0 | 2 | 2 |
| (010011s) | 0 | 0 | 7 | 7 |
| ... | ... | ... | ... | ... |

FIG. 2

| VARIABLE-LENGTH CODE | LAST | TOTAL CODE LENGTH | DECODED DATA |
|---|---|---|---|
| (10s)(10s)(10s) | 0、0、0 | 9 | 1、1、1 |
| (10s)(1111s)(10s) | 0、0、0 | 11 | 1、3、1 |
| (10s)(0111s) | 0、1 | 8 | 1、1 |
| (10s)(110s)(10s) | 0、0、0 | 10 | 1、23、1 |
| (1111s)(1111s)(10s) | 0、0、0 | 13 | 3、3、1 |
| (1111s)(1111s)(0111s) | 0、0、1 | 15 | 3、3、1 |
| (110s)(110s)(10s) | 0、0、0 | 11 | 23、23、1 |
| (0111s) | 1 | 5 | 1 |
| ... | ... | ... | ... |

F I G. 4

VARIABLE-LENGTH CODE DECODING APPARATUS, DECODING SYSTEM, AND VARIABLE-LENGTH CODE DECODING METHOD

CROSS REFERENCE TO RELATED APPLICATIONS

This application is based upon and claims the benefit of priority from the prior Japanese Patent Application No. 2011-146343, filed on Jun. 30, 2011, the entire contents of which are incorporated herein by reference.

FIELD

Embodiments of the present invention relate to a variable-length code decoding apparatus, a decoding system, and a variable-length code decoding method for decoding variable-length codes.

BACKGROUND

Variable-length codes in conformity with MPEG-4 standards, H.264, etc. have various code lengths. It is therefore impossible to uniquely identify the header position of each code in an input bitstream. Because of this, a sequential process is required to decode variable-length codes of an input bitstream one by one from the header and then detect the header position of a succeeding code. Accordingly, if many variable-length codes are included in an input bitstream, it takes many cycles to decode all the codes.

There have been proposed several techniques for decoding sequential variable-length codes contained in an input bitstream in parallel in order to reduce the number of cycles. For example, there has been proposed a technique for decoding two or more of variable-length codes on average in one cycle by performing pipeline decoding process. The technique is, however, disadvantageous in that the frequency that can be set for one cycle is not so high and the decoding efficiency could be lowered depending on the type of variable-length codes.

Another technique is to collectively decode combinations of sequential variable-length codes contained in an input bitstream, by enlarging size of a table for converting variable-length codes into coded data. The technique is, however, disadvantageous in that a large-scale table has to be prepared beforehand and the time for searching this table becomes long, hence it is impossible to raise an operational frequency.

BRIEF DESCRIPTION OF THE DRAWINGS

FIG. 2 shows an example of variable-length codes inconformity with MPEG-4 standards;

FIG. 4 is a view showing an example of a second table 12a.

DETAILED DESCRIPTION

Embodiments will now be explained with reference to the accompanying drawings.

A variable-length code decoding apparatus for decoding an input bitstream comprising a plurality of variable-length codes has a first table storing part capable of converting the variable-length codes into first decoded data comprising successive zeros, the number of the zeros being (M−1) or larger where M is an integer of 2 or more, a second table storing part capable of converting a first variable-length code comprising a code length of N where N is an integer of 2 or more and for which corresponding decoded data comprises no zeros, or capable of converting a combination of the first variable-length code and one or more second variable-length code for which corresponding decoded data comprises zeros, the number of the zeros being zero or larger but (M−2) or smaller, into second decoded data comprising nonzeros and zeros, the total number of the nonzeros and the zeros being at least (M−1), a third table storing part capable of converting a third variable-length code comprising a code length of N and for which corresponding decoded data comprises no zeros or capable of converting a combination of the third variable-length code and one or more fourth variable-length code for which corresponding decoded data comprises zeros, the number of the zeros being zero or larger but (M−2) or smaller, into third decoded data comprising nonzeros and zeros, the total number of the nonzeros and the zeros being at least (M−1), a bit shifting part configured to shift the input bitstream by a specific number of bits, a fourth table storing part capable of converting a variable-length code at a header of the bit-shifted input bitstream into fourth decoded data, a combining part configured to combine the second or the third decoded data and the fourth decoded data to generate fifth decoded data, and a final selection part configured to select either the first or the fifth decoded data.

Embodiments will now be explained with reference to the accompanying drawings.

Figure 1:
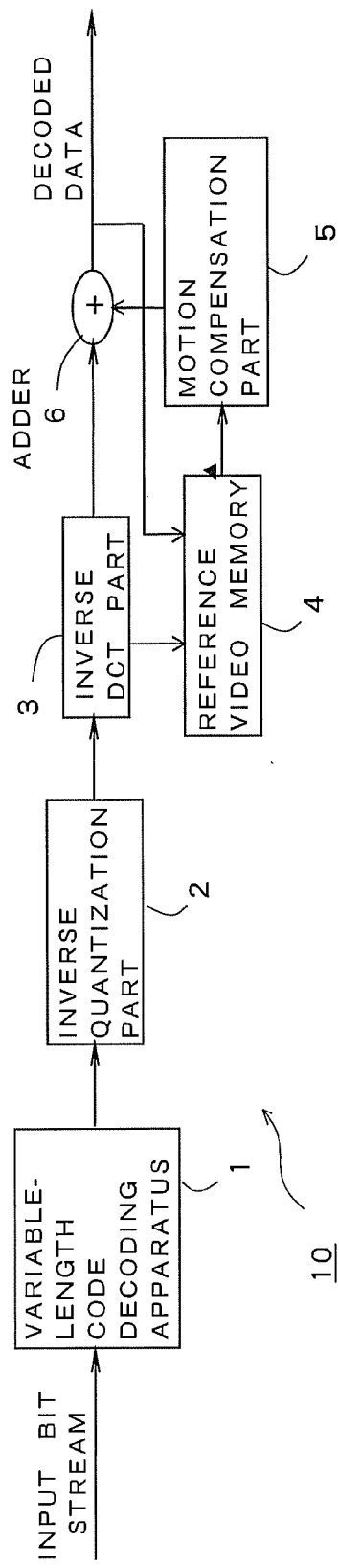
FIG. 1 is a block diagram schematically showing the configuration of a decoding system according to an embodiment of the present invention.

FIG. 1 is a block diagram schematically showing the configuration of a decoding system according to an embodiment. A decoding system 10 of FIG. 1 has a variable-length code decoding apparatus 1, an inverse quantization part 2, an inverse DCT part 3, a reference video memory 4, a motion compensation part 5, and an adder 6.

The variable-length code decoding apparatus 1 decodes variable-length codes included in an input bitstream to convert them into DCT (Discrete Cosine Transform) coefficients, for example. The inverse quantization part 2 inverse-quantizes decoded data output from the variable-length code decoding apparatus 1. The inverse DCT part 3 performs inverse discrete cosine transform to the data after inverse quantization to convert frequency-converted information into pixel information (video data). The motion compensation part 5 compares the video data obtained by conversion at the inverse DCT part 3 and video data of an immediately preceding frame to detect a motion compensation amount. The adder 6 adds the motion compensation amount to the video data obtained by conversion at the inverse DCT part 3 to generate final motion-compensated decoded data.

Next, the internal configuration and operation of the variable-length code decoding apparatus 1 will be explained in detail. An example of performing a decoding process for an input bitstream including variable-length codes in conformity with MPEG-4 standards will be explained hereinafter. The variable-length code decoding apparatus 1 according to the present embedment performs a process which converts an input bitstream into DCT coefficients. The DCT coefficients output from the variable-length code decoding apparatus 1 is referred to as decoded data, hereinafter.

Decoded data generated by the variable-length code decoding apparatus 1 includes zeros and nonzeros. The zeros and nonzeros are DCT coefficients. That is, decoded data generated by decoding one variable-length code is composed of a plurality of DCT coefficients.

(First Example of Variable-Length Code Decoding Apparatus 1)

An input bitstream includes a plurality of variable-length codes. In variable-length codes, a code word of higher frequency of appearance has a shorter code length. FIG. 2 shows an example of variable-length codes in conformity with MPEG-4 standards. The sign "s" in the column of variable-length code indicates a bit value expressing positive or negative, i.e. s=0 and s=1 express positive and negative, respectively. The sign "s" is also a code. For example, a variable-length code (10s) has a code length of 3. LAST is information used for identifying a variable-length code corresponding to the last nonzero when DCT coefficients are stored in a zigzag pattern from the left-upper corner to the right-lower corner in an 8×8 pixel block. LAST is "1" for a variable-length code corresponding to the last nonzero. LAST is "0" for the other variable-length codes. RUN expresses the number of successive zeros of decoded data corresponding to a variable-length code. LEVEL expresses a nonzero of decoded data corresponding to a variable-length code. The value of LEVEL is a value of decoded data. For example, decoded data of a variable-length code (10s) has LEVEL of "1".

Intra-coded variable-length code in conformity with MPEG-4 standards has the maximum and minimum code lengths of 13 and 3, respectively. There are six variable-length codes each with RUN of 0 and a code length of N smaller than 7. There are 29 variable-length codes each with RUN of 0 and a code length of N equal to or larger than 7.

Figure 3:
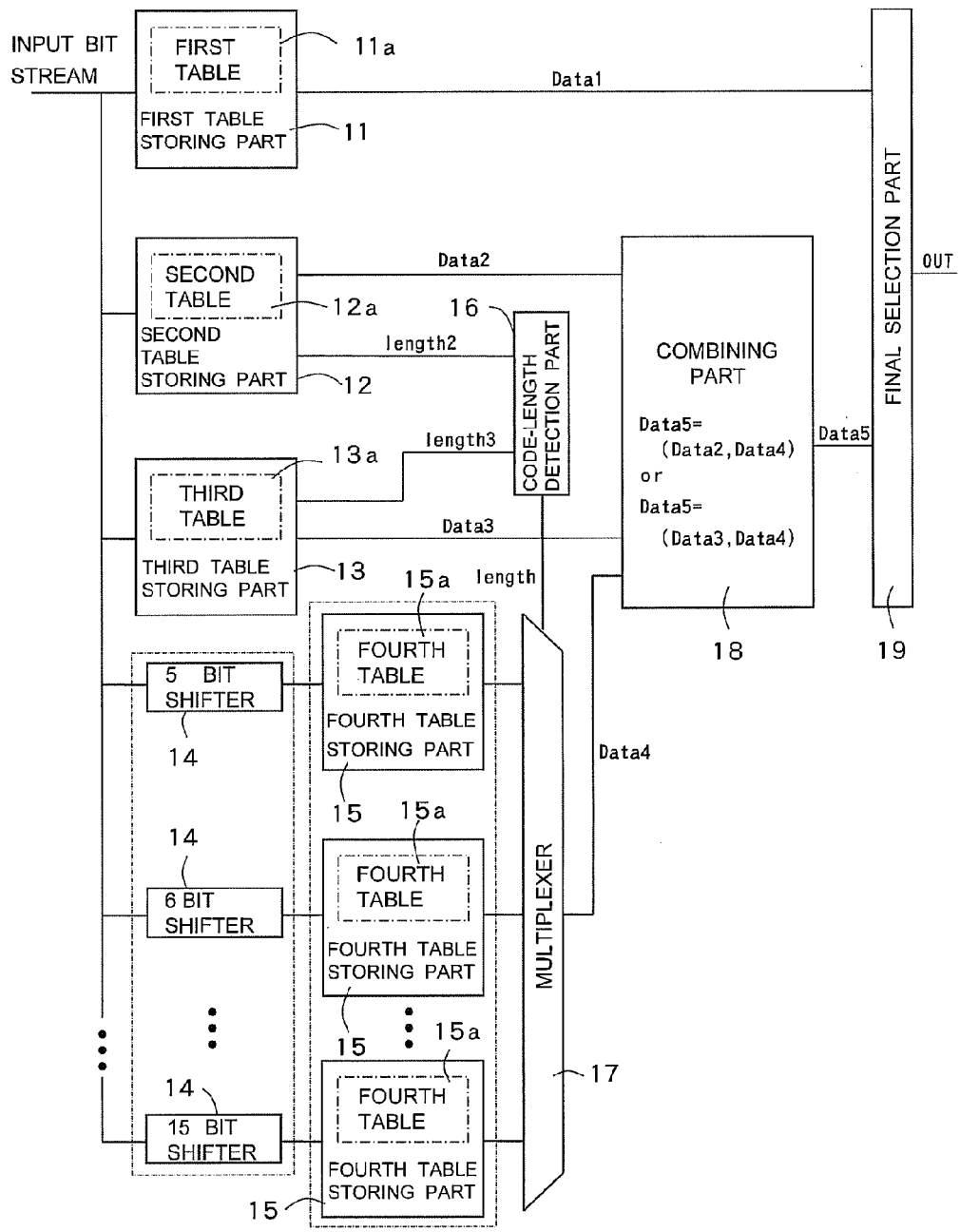
FIG. 3 is a block diagram of the internal configuration of a first example of a variable-length code decoding apparatus 1.

FIG. 3 is a block diagram showing the internal configuration of a first example of the variable-length code decoding apparatus 1. The variable-length code decoding apparatus 1 of FIG. 3 has a first table storing part 11 for storing a first table 11*a*, a second table storing part 12 for storing a second table 12*a*, a third table storing part 13 for storing a third table 13*a*, 5- to 15-bit shifters 14, fourth table storing parts 15 (11 in total) connected to the 5- to 15-bit shifters 14, respectively, a code-length detection part 16, a multiplexer (a decoded-data selection part) 17, a combining part 18, and a final selection part 19.

The first table 11*a* is a conversion table with which a variable-length code is converted into first decoded data having successive zeros, the number of which is (M−1) or larger (M being an integer of 2 or more).

The second table 12*a* is a conversion table with which a variable-length code or a combination of successive two or more variable-length codes is converted according to the following conversion requirements 1) and 2) into second decoded data having nonzeros and zeros, the total number of which is at least (M−1).

1) A variable-length code having a code length smaller than N (being an integer of 2 or more) is converted into decoded data with no zeros.

2) A variable-length code having a code length smaller than N is combined with another variable-length code which is provided next to this variable-length code and has zeros, the number of which is zero or larger but (M−2) or smaller, in order to perform conversion to decoded data.

The third table 13*a* is a conversion table with which a variable-length code or a combination of successive two or more variable-length codes is converted according to the following conversion requirements 3) and 4) into third decoded data having nonzeros and zeros, the total number of which is at least (M−1).

3) A variable-length code having a code length of N (being an integer of 2 or more) or larger is converted into decoded data with no zeros.

4) A variable-length code having a code length of N or larger is combined with another variable-length code which is provided next to this variable-length code and has zeros, the number of which is zero or larger but (M−2) or smaller, in order to perform conversion to decoded data.

With the above requirements, the second and third table 12*a* and 13*a* register different variable-length codes or their combinations. The requirements 1) and 3) are used for conversion of only one variable-length code into decoded data. The requirements 2) and 4) are used for conversion of a combination of two or more of variable-length codes into decoded data With any of the requirements, it is a principle that the total number of nonzeros and zeros of decoded data is (M−1) or larger. With the conversion technique described above, the (M−1) number or more of DCT coefficients can be generated in one cycle of a decoding process.

Here, M is the number of DCT coefficients decoded in one cycle of a decoding process, which is decided in accordance with required processing performance. N is the value for use in deciding the size of the second and third tables 12*a* and 13*a*. As N becomes larger, the second table 12*a* becomes larger but the third table 13*a* becomes smaller. As N becomes smaller, the second table 12*a* becomes smaller but the third table 13*a* becomes larger.

FIG. 4 is a view showing an example of the second table 12*a* at M=4 and N=7. Due to N=7, the second table 12*a* of FIG. 4 registers variable-length codes having a code length of 6 or smaller and their combinations. Moreover, due to M=4, decoded data in the second table 12*a* of FIG. 4 have at least three nonzeros. Since a variable-length code with LAST=1 is the last code, no further code is combined. Therefore, when a variable-length code with LAST=1 is decoded, the total number of nonzeros and zeros included in decoded data may be smaller than (M−1).

The data on the first line in FIG. 4 is a combination of the same three variable-length codes (10s). Each code has LAST of zero. The total code length is 9=3×3 bits. Each variable-length code (10s) corresponds to decoded data "1". The decoded data of (10s)(10s)(10s) is "1, 1, 1".

The second table 12*a* of FIG. 4 includes a table section with which only one variable-length code is converted into decoded data and another table section with which a combination of two or more of variable-length codes is converted into decoded data. The table section with which only one variable-length code is converted into decoded data corresponds to the requirement 1). The table section with which a combination of two or more of variable-length codes is converted into decoded data corresponds to the requirement 2).

The third table 13*a* also includes a table section with which only one variable-length code is converted into decoded data and another table section with which a combination of two or more of variable-length codes is converted into decoded data.

The first table storing part 11 converts a variable-length code using the first table 11*a* into first decoded data Data1 and outputs this data to the final selection part 19.

The second table storing part 12 converts a variable-length code using the second table 12*a* into second decoded data Data2 and outputs this data to the combining part 18, and outputs a code length length2 of the code before decoded into the decoded data Data2 to the code-length detection part 16. In the same way, the third table storing part 13 converts a variable-length code using the third table 13*a* into third decoded data Data3 and outputs this data to the combining part 18, and outputs a code length length3 of the code before decoded into the decoded data Data3 to the code-length detection part 16.

Conversion processes for obtaining decoded data at the first to third table storing parts 11 to 13 start at a header position of an input bitstream and are performed in parallel.

The bit shifters 14 shift an input bitstream by certain number of bits, respectively, to update the header position of the input bitstream. The reason for shifting the input bitstream by, for example, 5 to 15 bits at the bit shifters 14 is to shift the input bitstream by a code length of a variable-length code or a combination of successive two or more variable-length codes decoded using the second or the third table 12a or 13a, for decoding a succeeding variable-length code. Therefore, the amount of shifting at the bit shifters 14 depends on a code length of a variable-length code or a combination of successive two or more variable-length codes registered in the second or the third table 12a or 13a. Suppose that there are variable-length codes or combinations of variable-length codes registered in the second or the third table 12a or 13a, that have a code length of smaller than 5 bits, or of 16 bits or larger, for example. In this case, a certain number of bit shifters 14 is required for shifting the input bitstream by the number of bits corresponding to the code length of smaller than 5 bits, or of 16 bits or larger. In FIG. 3, the 5- to 15-bit shifters 14 are provided for variable-length codes or combinations of variable-length codes registered in the second or the third table 12a or 13a, which have a code length of 5 to 15 bits.

When an input bitstream is shifted by the bit shifters 14, input bitstreams having different herder positions are input to the fourth table storing parts 15 connected to the bit shifters 14. The fourth table storing parts 15 are provided for respective bit shifters 14. The fourth table storing parts 15 have fourth tables 15a that list the same items. Each fourth tables 15a stores all variable-length codes and the corresponding decoded data.

Each fourth table storing part 15 converts a variable-length code that starts at a shifted header position of the input bitstream into fourth decoded data. The fourth table storing parts 15 output decoded data that correspond to variable-length codes that start at header positions of the input bitstream shifted by the 5- to 15-bit shifters 14, respectively. Each fourth table 15a stores decoded data that correspond to all variable-length codes. Therefore, every fourth table storing part 15 outputs decoded data.

The decoding process using the bit shifters 14 and the fourth table storing parts 15 is performed in parallel with the decoding process using the second and third table storing parts 12 and 13.

When either the second or the third table storing part 12 or 13 outputs a code length, the code-length detection part 16 notifies the multiplexer 17 of the code length.

Based on the code length acquired by the code-length detection part 16, the multiplexer 17 selects one of the decoded data output from the fourth table storing parts 15. For example, when decoded data "1, 3, 1" that corresponds to a variable-length code (10s)(1111s)(10s) is selected from the second table 12a shown in FIG. 4, a code length of length2=11 is output from the second table storing part 12. The code-length detection part 16 supplies the code length of length2=11 to the multiplexer 17. Therefore, the multiplexer 17 selects decoded data output from the fourth table storing parts 15 connected to the 11-bit shifter 14. Accordingly, the fourth table storing parts 15 outputs decoded data that corresponds to a variable-length code obtained by shifting an input bitstream by 11 bits, in parallel with the process that the second table storing part 12 outputs the decoded data "1, 3, 1" that corresponds to variable-length codes (10s)(1111s)(10s).

The combining part 18 combines the second or the third decoded data Data2 or Data3 and the fourth decoded data Data4 selected by the multiplexer 17 with each other to generate fifth decoded data Data5.

The final selection part 19 selects either the first decoded data Data1 output from the first table storing part 11 or the fifth decoded data Data5 obtained by combination at the combining part 18.

When a variable-length code is input to any of the first to fourth table storing parts 11 to 13 and 15 that registers the variable-length code, the table storing part generates the correspond decoded data. On the other hand, when a variable-length code is input to any of the first to fourth table storing parts 11 to 13 and 15 that does not register the variable-length code, the table storing part generates meaningless data (error data). Therefore, the first to fourth table storing parts 11 to 13 and 15 have to notify the final selection part 19 of whether data output therefrom is meaningful decoded data so that the final selection part 19 does not combine error data with decoded data. For example, it is preferable for the first table storing part 11, when outputting normal decoded data, to output a code length of a variable-length code in addition to the normal decoded data whereas to output a code length of zero when outputting error data. With the value of this code length, the final selection part 19 can correctly determine whether to select output data Data1 of the first table storing part 11.

When the first decoded data Data1 is generated using the first table storing part 11, the results of processing at the second to fourth table storing parts are not used. Accordingly, the final selection part 19 selects the first decoded data Data1. On the other hand, when the first decoded data Data1 is not generated, decoded data are generated from the second to fourth table storing parts, hence the final selection part 19 selects the fifth decoded data Data5.

The fifth decoded data Data5 obtained by combining the second or the third decoded data Data2 or Data3 and the fourth decoded data Data4 contains at least an M number of DCT coefficients. The first decoded data Data1 contains the M number of DCT coefficients.

As described above, in both of the cases of performing conversion into decoded data using the first table storing part 11 and using the second to fourth table storing parts 12, 13 and 15, each decoded data contains at least the M number of DCT coefficients. This means, from the different point of view, that at least the M number of DCT coefficients can be generated in one cycle of a decoding process no matter what variable-length code is included in an input bitstream. It is therefore understood that efficient decoding is performed with the conversion described above.

An operation of the first example of the variable-length code decoding apparatus 1 shown in FIG. 3 will be explained hereinafter. An input bitstream is input to the first to third table storing parts 11 to 13 and the bit shifters 14. The first to third table storing parts 11 to 13 start a search bit by bit, from the header position of the input bitstream, to search whether there is a bit pattern, in the input bitstream, that matches a variable-length code or a combination of successive two or more variable-length codes registered in the first to third tables 11a to 13a, respectively. When a bit pattern is detected that matches a variable-length code or a combination of successive two or more variable-length codes registered in any one of the tables, the corresponding decoded data is output from the table where there is a match. When there is a match in the first table 11a, the total number of zeros and nonzeros or DCT coefficients of decoded data is M. On the other hand, when there is a match in the second or the third table 12a or 13a, the total number of DCT coefficients of decoded data is (M−1) or larger.

As described above, an input bitstream is input to the first to third table storing parts 11 to 13 in parallel and undergoes a search process in the first to third tables 11a to 13a in parallel. As a result, decoded data that contains the M number of or the (M−1) number or more of DCT coefficients is generated in one cycle of a decoding process.

The second and third tables 12a and 13a register different variable-length codes and their combinations. Therefore, no decoded data are output at the same timing from the second and third tables 12a and 13a. In other words, decoded data and a code length are output from either the second or the third table 12a or 13a.

Moreover, an bitstream is shifted by the 5- to 15-bit shifters 14 by 5 to 15 bits, respectively, so that the header position of the input bitstream is shifted by each bit shifter. In other words, the bit shifters 14 shift the header position of the input bitstream to detect a variable-length code that follows a variable-length code and a combination of successive two or more variable-length codes decoded at the second or the third table storing part.

Each of the fourth table storing parts 15 connected to the 5- to 15-bit shifters 14, respectively, detects a variable-length code from the header position of an input bitstream. Then, a bit pattern that matches a variable-length code detected from each fourth table 15a is searched. Decoded data corresponding to the bit pattern is input to the multiplexer 17. The bit shifters 14 are provided so that the header position of the input bitstream is shifted by the code length of a variable-length code to be decoded at the second or the third table storing part 12 or 13. Therefore, a bit pattern that has a match at any one of the 5- to 15-bit shifters 14 is detected and then the corresponding decoded data is output.

A code length output from either the second or the third table storing part 12 or 13 is detected by the code-length detection part 16 and then output to the multiplexer 17. Based on the code length from the code-length detection part 16, the multiplexer 17 selects decoded data output from any one of the fourth table storing parts 15.

Decoded data Data2 output from the second table storing part 12 or the decoded data Data3 output from the third table storing part 13 and decoded data Data4 selected based on a code length are combined at the combining part 18. Accordingly, when decoded data are generated at the second to fourth table storing parts 12, 13 and 15, decoded data that contains the M number or more of DCT coefficients in total is generated.

A decoding process at the first table storing part 11 and a decoding process at the second to fourth table storing parts 12, 13 and 15, both generate decoded data containing at least the M number of DCT coefficients in one cycle.

The variable-length codes registered in the first table 11a are different from the variable-length codes and their combinations listed in the second and third tables 12a and 13a. Therefore, when the first table storing part 11 generates decoded data, the second or the third table storing part 12 or 13 does not generate any decoded data. Conversely, when the second or the third table storing part 12 or 13 generates decoded data, the first table storing part 11 does not generate any decoded data. Accordingly, the final selection part 19 selects either the first or the fifth decoded data.

As described above, in the first example of the variable-length code decoding apparatus 1, a decoding process is performed to an input bitstream using the first to fourth table storing parts 11 to 13 and 15 in parallel. Therefore, decoded data that contains at least the M number of DCT coefficients in one cycle is generated, hence a decoding process can be performed at a high speed.

(Second Example of Variable-Length Code Decoding Apparatus 1)

The variable-length code decoding apparatus 1 of FIG. 3 is provided with eleven fourth table storing parts 15. Each fourth table 15a registers decoded data that corresponds to all variable-length codes. Therefore, a data capacity becomes large when there are many types of variable-length codes. In addition, the variable-length code decoding apparatus 1 of FIG. 3 has to be provided with eleven fourth table storing parts 15. This is a cause that circuit scale become large. The second example of the variable-length code decoding apparatus 1 has a feature in that the number of the table storing parts 15 is decreased.

The second example of the variable-length code decoding apparatus 1 has the same block arrangements as shown in FIG. 3, but the second example is different from FIG. 3 in the contents of the second table 12a. The second table 12a of the second example registers variable-length codes and the combinations that meet the following requirement 5) in addition to the requirements 1) and 2).

5) A total code length of a variable-length code or a combination of the variable-length codes is K (K being an integer of 2 or more) or larger.

For example, at K=7, a code length is at least seven bits for a variable-length code or a combination of the variable-length codes to be decoded at the second table storing part 12. Therefore, the succeeding variable-length code starts at a position obtained by shifting the header position of the input bitstream by at least seven bits. Accordingly, the 5- and 6-bit shifters 14 and the two fourth table storing parts 15 connected thereto are not required, hence the second table 12a can have a larger size to that extent. Therefore, it is preferable to set K to an appropriate value under consideration of reduction in circuit scale for the unrequired bit shifters 14 and fourth table storing parts 15 but increase in circuit scale due to a larger size of the second table 12a.

As described above, there is a limitation on a code length of a variable-length code or on a total code length of this code and another variable-length code to undergo a decoding process at the second table storing part 12. With the limitation, the number of the bit shifters 14 and the fourth table storing parts 15 can be decreased, and hence the circuit scale can be scaled down. Also in this second example, like the first example, decoded data that contains at least the M number of DCT coefficients in one cycle is generated. Therefore, a decoding process can be performed at a high speed.

(Third Example of Variable-Length Code Decoding Apparatus 1)

If the number M of DCT coefficients decodable in one cycle of a decoding process is increased, the number of DCT coefficients decodable in one cycle is increased. Therefore, an input bitstream can be decoded at a high speed. Nevertheless, if the number M is increased, although the number of registration in the first tables 11a is decreased, the number of registration in the second and third tables 12a and 13a is increased. This means that the number of combinations of variable-length codes is increased in the second and third tables 12a and 13a. Due to this increase, the data capacity of these tables becomes large, hence a search could take a long time. Therefore, it is preferable to set M to an appropriate value under consideration of the data capacity of the second and third tables 12a and 13a and the search time in theses tables.

It is also preferable to add the following requirement 6) to the first table, in addition to the requirement 1) described above.

6) Variable-length codes for which the number of zeros of decoded data is zero or larger but (M−2) or smaller are combined in generation of decoded data, the total of nonzeros and zeros of the decoded being at least M.

By adding the requirement 6), the number of registration in the first table 11a is increased, however, the number of registration in the second and third table 12a and 13a can be decreased, and hence the entire circuit can be scaled down.

The above embodiment has described a decoding process for variable-length codes in conformity with MPEG-4 standards. However, the present invention is applicable to several types of variable-length codes, such as MPEG-2 and H.264.

At least part of the variable-length code decoding apparatus 1 and the decoding system 10 explained in the embodiment may be configured with hardware or software. When it is configured with software, a program that performs at least part of the functions of the image match-point detection apparatus may be stored in a storage medium such as a flexible disk and CD-ROM, and then installed in a computer to run thereon. The storage medium may not be limited to a detachable one such as a magnetic disk and an optical disk but may be a standalone type such as a hard disk drive and a memory.

Moreover, a program that achieves the function of at least part of the variable-length code decoding apparatus 1 and the decoding system 10 may be distributed via a communication network (including wireless communication) such as the Internet. The program may also be distributed via an online network such as the Internet or a wireless network, or stored in a storage medium and distributed under the condition that the program is encrypted, modulated or compressed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A variable-length code decoding apparatus for decoding an input bitstream comprising a plurality of variable-length codes, comprising:
a first table storing part capable of converting the variable-length codes into first decoded data comprising successive zeros, the number of the zeros being (M−1) or larger where M is an integer of 2 or more;
a second table storing part capable of converting a first variable-length code comprising a code length of N where N is an integer of 2 or more and for which corresponding decoded data comprises no zeros, or capable of converting a combination of the first variable-length code and one or more second variable-length code for which corresponding decoded data comprises zeros, the number of the zeros being zero or larger but (M−2) or smaller, into second decoded data comprising nonzeros and zeros, the total number of the nonzeros and the zeros being at least (M−1);
a third table storing part capable of converting a third variable-length code comprising a code length of N and for which corresponding decoded data comprises no zeros or capable of converting a combination of the third variable-length code and one or more fourth variable-length code for which corresponding decoded data comprises zeros, the number of the zeros being zero or larger but (M−2) or smaller, into third decoded data comprising nonzeros and zeros, the total number of the nonzeros and the zeros being at least (M−1);
a bit shifting part configured to shift the input bitstream by a specific number of bits;
a fourth table storing part capable of converting a variable-length code at a header of the bit-shifted input bitstream into fourth decoded data;
a combining part configured to combine the second or the third decoded data and the fourth decoded data to generate fifth decoded data; and
a final selection part configured to select either the first or the fifth decoded data.

2. The variable-length code decoding apparatus in claim 1, wherein the specific number of bits corresponds to a code length of the variable-length code or a code length of the combination of successive two or more variable-length codes before converted into decoded data at the second or the third table storing part.

3. The variable-length code decoding apparatus in claim 1, wherein the bit shifting part comprises a plurality of bit shifters each configured to shift the input bitstream by a specific number of bits, the specific number corresponding to a code length of the variable-length code or a code length of the combination of successive two or more variable-length codes decodable at the second and third table storing parts, and
the fourth table storing part is provided for each bit shifter.

4. The variable-length code decoding apparatus in claim 1, wherein the fourth table storing part stores all variable-length codes and decoded data corresponding to the all variable-length codes.

5. The variable-length code decoding apparatus in claim 1 further comprising:
a code-length detection part configured to detect a code length of the variable-length code or of the combination of successive two or more variable-length codes before converted into the second or the third decoded data; and
a decoded data selection part configured to select the fourth decoded data that is obtained by shifting the input bitstream by a detected code length and to output the selected fourth decoded data to the combining part.

6. The variable-length code decoding apparatus in claim 1, wherein a decoding process using the second or the third table storing part and a decoding process using the bit shifting part and the fourth table storing part are performed in parallel with each other.

7. The variable-length code decoding apparatus in claim 1, wherein the second table storing part is capable of converting the first variable-length code comprising a code length of K where K is an integer of 2 or more or a combination of the first and second variable-length codes comprising a total code length of K into the second decoded data.

8. The variable-length code decoding apparatus in claim 1, wherein the first table storing part is capable of converting a fifth variable-length code for which corresponding decoded data comprises zeros, the number of the zeros being zero or larger but (M−2) or smaller and a combination of the fifth variable-length code and one or more sixth variable-length code into the first decoded data comprising nonzeros and zeros, the total number of the nonzeros and the zeros being at least M.

9. A decoding system comprising:

a variable-length code decoding apparatus configured to perform variable-length code decoding to an input bitstream comprising a plurality of variable-length codes that have undergone motion compensation, discrete cosine transform, and quantization, thus generating decoded data;

an inverse quantization part configured to perform inverse quantization to the decoded data;

an inverse discrete cosine transform part configured to perform inverse discrete cosine transform to data obtained by the inverse quantization; and a motion compensation part configured to perform motion compensation to data obtained by the inverse discrete cosine transform, wherein the variable-length code decoding apparatus includes:

a first table storing part capable of converting the variable-length codes into first decoded data comprising successive zeros, the number of the zeros being (M−1) or larger where M is an integer of 2 or more;

a second table storing part capable of converting a first variable-length code comprising a code length of N where N is an integer of 2 or more and for which corresponding decoded data comprises no zeros or capable of converting a combination of the first variable-length code and one or more second variable-length code for which corresponding decoded data comprises zeros, the number of the zeros being zero or larger but (M−2) or smaller, into second decoded data comprising nonzeros and zeros, the total number of the nonzeros and the zeros being at least (M−1);

a third table storing part capable of converting a third variable-length code comprising a code length of N and for which corresponding decoded data comprises no zeros or capable of converting a combination of the third variable-length code and one or more fourth variable-length code for which corresponding decoded data comprises zeros, the number of the zeros being zero or larger but (M−2) or smaller, into third decoded data comprising nonzeros and zeros, the total number of the nonzeros and the zeros being at least (M−1);

a bit shifting part configured to shift the input bitstream by a specific number of bits;

a fourth table storing part capable of converting a variable-length code at a header of the bit-shifted input bitstream into fourth decoded data;

a combining part configured to combine the second or the third decoded data and the fourth decoded data to generate fifth decoded data; and a final selection part configured to select either the first or the fifth decoded data.

10. The decoding system in claim 9, wherein the specific number of bits corresponds to a code length of the variable-length code or a code length of the combination of successive two or more variable-length codes before converted into decoded data at the second or the third table storing part.

11. The decoding system in claim 9, wherein the bit shifting part comprises a plurality of bit shifters each configured to shift the input bitstream by a specific number of bits, the specific number corresponding to a code length of the variable-length code or a code length of the combination of successive two or more variable-length codes decodable at the second and third table storing parts, and the fourth table storing part is provided for each bit shifter.

12. The decoding system in claim 9, wherein the fourth table storing part stores all variable-length codes and decoded data corresponding to the all variable-length codes.

13. The decoding system in claim 9 further comprising:

a code-length detection part configured to detect a code length of the variable-length code or of the combination of successive two or more variable-length codes before converted into the second or the third decoded data; and a decoded data selection part configured to select the fourth decoded data that is obtained by shifting the input bitstream by a detected code length and to output the selected fourth decoded data to the combining part.

14. The decoding system in claim 9, wherein a decoding process using the second or the third table storing part and a decoding process using the bit shifting part and the fourth table storing part are performed in parallel with each other.

15. The decoding system in claim 9, wherein the second table storing part is capable of converting the first variable-length code comprising a code length of K where K is an integer of 2 or more or a combination of the first and second variable-length codes comprising a total code length of K into the second decoded data.

16. The decoding system in claim 9, wherein the first table storing part is capable of converting a fifth variable-length code for which corresponding decoded data comprises zeros, the number of the zeros being zero or larger but (M−2) or smaller and a combination of the fifth variable-length code and one or more sixth variable-length code into the first decoded data comprising nonzeros and zeros, the total number of the nonzeros and the zeros being at least M.

17. A variable-length code decoding method for decoding an input bitstream composed of a plurality of variable-length codes, comprising the steps of:

searching a first table capable of converting the variable-length codes into first decoded data comprising successive zeros, the number of the zeros being (M−1) or larger where M is an integer of 2 or more, to specify whether there is a variable-length code at a header position of the input bitstream in the first table;

searching a second table capable of converting a first variable-length code comprising a code length of N where N is an integer of 2 or more and for which corresponding decoded data comprises no zeros or capable of converting a combination of the first variable-length code and one or more second variable-length code for which corresponding decoded data comprises zeros, the number of the zeros being zero or larger but (M−2) or smaller, into second decoded data comprising nonzeros and zeros, the total number of the nonzeros and the zeros being at least (M−1), to specify whether there is a variable-length code at a header position of the input bitstream or a combination of successive two or more variable-length codes at the header position in the second table;

searching a third table capable of converting a third variable-length code comprising a code length of N and for which corresponding decoded data comprises no zeros or capable of converting a combination of the third variable-length code and one or more fourth variable-length code for which corresponding decoded data comprises zeros, the number of the zeros being zero or larger but (M−2) or smaller, into third decoded data comprising nonzeros and zeros, the total number of the nonzeros and the zeros being at least (M−1), to specify whether there is a variable-length code at a header position of the input bitstream or a combination of successive two or more variable-length codes at the header position in the third table;

shifting the input bitstream by a specific number of bits;

converting a variable-length code at a header of the bit-shifted input bitstream into fourth decoded data using a fourth table capable of converting the variable-length code at the header of the bit-shifted input bitstream into the fourth decoded data;

combining the second or the third decoded data and the fourth decoded data to generate fifth decoded data; and selecting either the first or the fifth decoded data.

18. The variable-length code decoding method in claim 17, wherein the specific number of bits corresponds to a code length of the variable-length code or a code length of the combination of successive two or more variable-length codes before converted into the second or the third decoded data.

19. The variable-length code decoding method in claim 17, wherein when shifting the input bitstream by the specific number of bits, the input bitstream is shifted by a specific number of bits, the specific number corresponding to a code length of the variable-length code or a code length of the combination of successive two or more variable-length codes from which the second and third decoded data are decodable, using a plurality of bit shifters, and the fourth table storing part is provided for each bit shifter.

20. The variable-length code decoding method in claim 17, wherein the fourth table stores all variable-length codes and decoded data corresponding to the all variable-length codes.

\* \* \* \* \*